United States Patent
Huss et al.

(10) Patent No.: US 11,238,204 B1
(45) Date of Patent: Feb. 1, 2022

(54) TRANSMITTER TEST WITH INTERPOLATION

(71) Applicant: Cadence Design Systems, Inc., San Jose, CA (US)

(72) Inventors: Scott David Huss, Cary, NC (US); Loren B. Reiss, Raleigh, NC (US); Fred Staples Stivers, Raleigh, NC (US); Steven Martin Broome, Apex, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 2 days.

(21) Appl. No.: 17/066,284

(22) Filed: Oct. 8, 2020

(51) Int. Cl.
- *G06F 30/30* (2020.01)
- *G01R 31/317* (2006.01)
- *G01R 31/3183* (2006.01)
- *G01R 31/3187* (2006.01)
- *G06F 30/333* (2020.01)

(52) U.S. Cl.
CPC ....... *G06F 30/333* (2020.01); *G01R 31/3187* (2013.01); *G01R 31/31704* (2013.01); *G01R 31/318385* (2013.01)

(58) Field of Classification Search
None
See application file for complete search history.

(56) References Cited

U.S. PATENT DOCUMENTS

| | | | |
|---|---|---|---|
| 7,366,966 B2 * | 4/2008 | LeBerge | G11C 29/56 714/718 |
| 8,468,398 B2 * | 6/2013 | Jiang | G01R 31/31716 714/717 |
| 10,419,203 B1 * | 9/2019 | Novellini | H04L 7/0331 |

OTHER PUBLICATIONS

H. Kim et al., "A Built-In Self-Test Scheme for DDR Memory Output Timing Test and Measurement," 2012 IEEE 30th VLSI Test Symposium (VTS), pp. 7-12. (Year: 2012).*

* cited by examiner

*Primary Examiner* — Leigh M Garbowski
(74) *Attorney, Agent, or Firm* — Schwegman Lundberg & Woessner, P.A.

(57) ABSTRACT

Various embodiments provide for testing a transmitter with interpolation, which can be used with a circuit for data communications, such as serializer/deserializer (SerDes) communications. In particular, some embodiments provide for data transmission test of a transmitter by: generating and outputting a pre-determined data pattern through a serializer of the transmitter; sampling a serialized data output of the serializer over a plurality of different interpolation phase positions of a phase interpolator; and using a pattern checker to error check the sampled data over the plurality of different interpolation phase positions to determine whether the data transmission test passes.

20 Claims, 7 Drawing Sheets

TRANSMITTER TEST WITH INTERPOLATION

TECHNICAL FIELD

Embodiments described herein relate to data communications and, more particularly, to test a transmitter with interpolation, which can be used with a communication circuit, such as a data serializer.

BACKGROUND

Digital communication transmitter circuits, such as ones that include a data serializer (hereafter, serializer), are usually tested by its manufacturer using a test that is built into the transmitter circuits. Such a test is often referred to as a built-in-self test or BIST of a circuit. In the context of data communication between two integrated circuits (e.g., die-to-die data communication), communication is facilitated by a transmitter and a receiver that are implemented on separate integrated circuits (e.g., separate integrated circuit (IC) die). As such, prior to the separate integrated circuits being coupled together, a built-in test of the transmitter is typically performed using a full receiver to test (e.g., screen) a transmit macro outputted by the transmitter.

BRIEF DESCRIPTION OF THE DRAWINGS

Various ones of the appended drawings merely illustrate example embodiments of the present disclosure and should not be considered as limiting its scope.

DETAILED DESCRIPTION

Various embodiments provide for testing a transmitter with interpolation, which can be used with a circuit for data communications, such as serializer/deserializer (SerDes) communications. In particular, various embodiments facilitate testing (e.g., built-in testing) of a transmitter without use of a receiver. For instance, a transmitter tested by various embodiments is implemented on a first integrated circuit (e.g., first IC die), where the transmitter facilitates communication (e.g., die-to-die communication) between the first integrated circuit and a second integrated circuit (e.g., second IC die) that implements a receiver. Some embodiments enable testing of a transmitter (e.g., on a first integrated circuit) prior to the transmitter being coupled to a receiver (e.g., on a second integrated circuit). For example, some embodiments enable a BIST on a transmitter die to be tested by down-sampling the transmitter data, sampling with a single comparator, and without need for a loop-back receiver, which can permit the transmitter die to be tested while the transmitter operating at normal data rates.

Some embodiments provide for data transmission test of a transmitter by: generating and outputting a pre-determined data pattern (e.g., a pseudorandom binary sequence (PRBS), such as PRBS7) through a serializer of the transmitter (e.g., output at full data transmission speed); sampling (e.g., sub-sampling) a serialized data output of the serializer over a plurality of different interpolation phase positions of a phase interpolator; and using a pattern checker to error check the sampled data over the plurality of different interpolation phase positions to determine whether the data transmission test passes. Sampling over the plurality of different interpolation phase positions can permit various embodiments to avoid using clock data recovery (CDR) to facilitate a data transmission test. The pre-defined data pattern can comprise, for example, PRBS7, PRBS15, PRBS23, PRBS31, or a user-defined data pattern (e.g., 1, 2, 3, or 4 32-bit words).

For example, an embodiment can use a phase interpolator (e.g., combined with a divider) to generate an interpolated clock signal over a plurality of interpolator phase positions (e.g., 8, 32, or 128 phase positions) of the phase interpolator. A data sampler can sample an output of a serializer (e.g., sample one bit) every full unit interval (FUI) of the interpolated clock signal as the serializer outputs the pre-defined data pattern as serialized data. For instance, the interpolated clock signal can be interpolated by the phase interpolator (e.g., combined with a divider) over different 128 phase positions, the pre-defined data pattern repeating every 127 unit interval (UI), and the data sampler can sample a single bit every 128 UIs. An example of this is illustrated and described with respect to FIG. 2. In another instance, the interpolated clock signal can be interpolated by the phase interpolator over different 32 phase positions, the pre-defined data pattern repeating every 31 UIs, and the data sampler can sample a single bit every 32 UIs.

Continuing with the example, as the pre-determined data pattern is outputted by the serializer (e.g., consecutively outputted every 127 UI where 128 phase positions are possible by phase interpolator), the data sampler can sample the output of the serializer based on an interpolated clock signal that is generated by the phase interpolator while the phase interpolator is set to an individual interpolator phase position. This can result in a plurality of sampled bits (e.g., a 127-bit word) being collected from the data sampler (e.g., collected into a bit array) for the individual interpolator phase position. A pattern checker can error check the plurality of sample bits based on the pre-determined data pattern. The result of the error check can be collected, the phase interpolator can be set to a next interpolator phase position (e.g., the phase interpolator can be bumped up or down by 1), and the steps noted above can be repeated for the next interpolator phase position. Once the error check results are collected for a plurality of interpolator phase positions (e.g., all 128 possible interpolator phase positions) in this manner, the data transmission test can be declared to pass or fail based on the plurality of error check results. For instance, if the number of passing error check results (e.g., results that indicate no error found) surpasses a pre-determined (pass) threshold value, the data transmission test can be declared to pass, otherwise the data transmission test can be declared to fail. The pre-determined (pass) threshold value can represent a minimum number passing error results needed for the data transmission test to be declared to pass (e.g., for 128 interpolator phase positions, the pre-determined threshold value can be set to 65). Alternatively, if the number of failing error check results (e.g., results that indicate an error) does not surpass a pre-determined (fail) threshold value, the data transmission test can be declared to pass, otherwise the data transmission test can be declared to fail. In yet another example, the error check results can be averaged to determine whether the data transmission test is declared to pass or fail.

As described herein, a pattern checker can be configured collect a plurality of sampled bits for an interpolated phase position from a data sampler. According to some embodiments, the pattern checker collects the plurality of sampled bits into a matrix (e.g., bit matrix) to facilitate comparison based on (e.g., against) a pre-determined data pattern (e.g., PRBS7). For instance, the plurality of sampled bits collected into a first matrix can be compared to a data mask that represents passing data, where the data mask is implemented as a second matrix of the same dimensions as the first matrix. Accordingly, where the plurality of sampled bits collected from the data sampler comprises a 32-bit word, the 32-bit word can be collected into a first matrix having dimensions of 4 bits×8 bits, and the data mask used to compare against the first matrix can have dimensions of 4 bits×8 bits. An example of this is illustrated and described with respect to FIG. 3. For some embodiments, each row of the first matrix of the sampled bits is compared to (e.g., against) a corresponding row of the second matrix of the data mask. If there is a mismatch between a given row of the first matrix and a corresponding row of the second matrix, either the given row of the first matrix or the corresponding row of the second matrix can be shifted by one or more bits (e.g., just one bit position) to a left direction or a right direction (e.g., or both shifted independently). This shift and comparison can be repeated in search of a match until either a comparison results in a match for the given row or the number of times the shift and comparison occurs surpasses a threshold value.

By use of various embodiments, a transmitter can perform a transmission test without use of a receiver (e.g., a loop-back receiver disposed on the same IC die as the transmitter, or a receiver disposed on a separate IC die), such as a receiver that uses a deserializer where the transmitter uses a serializer. This can reduce power or area that would otherwise be used if a loop-back receiver were included on the IC die of a transmitter to facilitate data transmission testing. This can also permit transmission test (e.g., transmission BIST) where a die only comprises a transmitter (TX) circuit TX and lacks a receiver (RX) circuit to loop it back to for test. Additionally, use of various embodiments can enable a transmitter to perform a data transmission test at-speed (e.g., at full data transmission speed or normal data rates).

Reference will now be made in detail to embodiments of the present disclosure, examples of which are illustrated in the appended drawings. The present disclosure may, however, be embodied in many different forms and should not be construed as being limited to the embodiments set forth herein.

Figure 1:
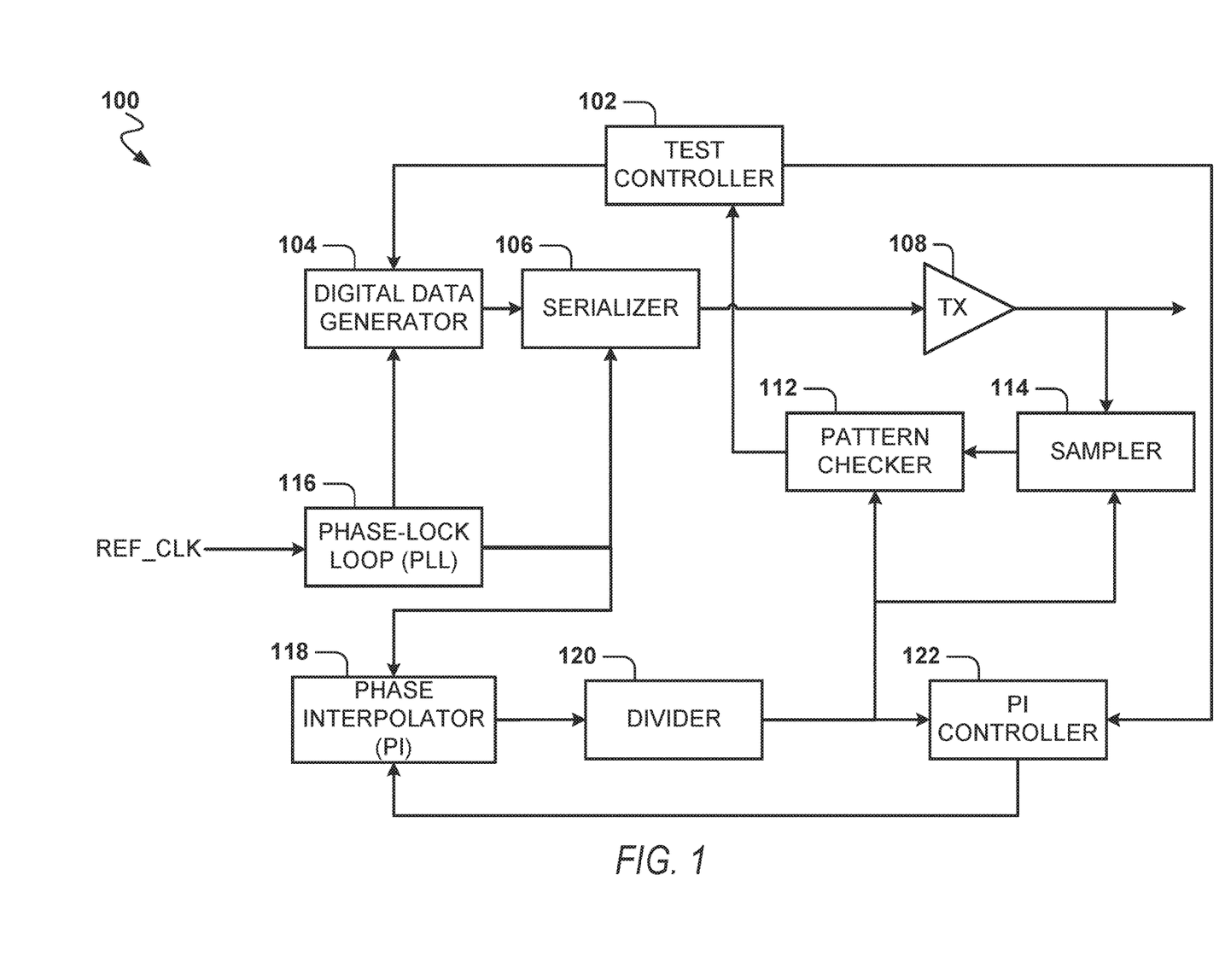
FIG. 1 is a schematic illustrating an example circuit that implements testing a transmitter with interpolation, in accordance with various embodiments.

FIG. 1 is a schematic illustrating an example circuit 100 that implements testing a transmitter with interpolation, in accordance with various embodiments. As shown, the circuit 100 comprises a test controller 102, a digital data generator 104, a serializer 106, a driver 108, a data sampler 114 (hereafter, the sampler 114), a pattern checker 112, a phase-lock loop (PLL) 116, a phase interpolator (PI) 118, a divider 120, and a phase interpolator (PI) controller 122. As also shown, the PI 118 is coupled to an output of the PLL 116, the divider 120 is coupled to an output of the PI 118, each of the pattern checker 112, the sampler 114, and the PI controller 122 is coupled to an output of the divider 120, and the PI 118 is also coupled to an output of the PI controller 122.

For some embodiments, the test controller 102 controls operation of the digital data generator 104 to facilitate generation of a pre-defined data pattern during a data transmission test as described herein, and controls operation of the PI 118 (via the PI controller 122) to set (e.g., adjust) an interpolated phase position of the PI 118 during a data transmission test as described herein. Additionally, for some embodiments, the test controller 102 collects one or more error check results (for sampled bits collected via the sampler 114 while the PI 118 is set to different individual interpolated phase positions) provided by the pattern checker 112 to determine whether a test result of a data transmission test is a pass or a fail based on the one or more check results as described herein.

The digital data generator 104 of some embodiments generates digital data and outputs the digital data as parallel digital data. For example, the digital data generator 104 can comprise a parallel data output interface for outputting the parallel digital data. The digital data generator 104 can receive and operate based on a clock signal (e.g., FUI/32) generated by the PLL 116. For some embodiments, the digital data generator 104 generates and outputs (to the serializer 106) a pre-defined data pattern that facilitates a data transmission test as described herein. For example, the pre-defined data pattern can comprise PRBS7, PRBS15, PRBS23, PRBS31, or a user-defined data pattern (e.g., 1, 2, 3, or 4 32-bit words).

During operation, the PLL 116 can receive a reference clock signal (REF_CLK), generate a set of clock signals (e.g., four quarter-rate clock signals) based on the reference clock signal, and generate a clock signal (e.g., FUI/32) for the digital data generator 104. The set of clock signals generated by the PLL 116 is provided to the serializer 106 and to the PI 118, which can facilitate generation of an interpolated clock signal used by the pattern checker 112 and the sampler 114 in accordance with various embodiments. For some embodiments, the PI 118 has a plurality of interpolator phase positions (e.g., 8, 32, or 128 phase positions), which facilitates sampling by the sampler 114 as described herein. For instance, where the pre-determined data pattern comprises PRBS5, the pre-determine data pattern repeats every 31 UI, which can be sampled at a frequency of FUI/32. The PI 118 can update at full unit interval (FUI) of 32 (FUI/32) and can have a step size that is a fraction of the unit interval (UI) period (e.g., step size of TUI/32), where FUI is the frequency of the bit rate (e.g., 40 GHz for a 40 GB/s data transmission link) and where TUI is the bit period (e.g., where TUI is 25 ps for a 40 GB/s link). In another instance, where the pre-determined data pattern comprises PRBS7, the pre-determine data pattern repeats every 127 UI, which can be sampled at a frequency of FUI/128. The PI 118 can update at FUI of 128 (FUI/128) and can have a step size that is a fraction of the UI period (e.g., step size of TUI/128).

The divider 120 can receive a clock signal generated by the PI 118, and generates a divided clock signal based on the received clock signal. For some embodiments, this divided clock signal represents the interpolated clock signal that is used by each of the pattern checker 112 and the sampler 114. For various embodiments, the PI controller 122 facilitates feedback adjustment of the PI 118 based on the divided clock signal generated by the divider 120. Additionally, the PI controller 122 can facilitate setting the PI 118 to an individual interpolator phase position (e.g., one of a plurality of interpolator phase positions supported by the PI 118) in accordance with various embodiments.

For some embodiments, the serializer 106 receives parallel digital data (e.g., having a data width of 32-bit) from the digital data generator 104 and the set of clock signals from the PLL 116, and generates serialized digital data based on the parallel digital data and the set of clock signals. For example, the serializer 106 can convert the parallel digital data (e.g., pre-determined data pattern generated by the digital data generator 104) to the serialized digital data using the set of clock signals. For some embodiments, the serializer 106 is implemented by a plurality of serializers coupled in series. For instance, the serializer 106 can comprise an 8-to-1 serializer and a 4-to-1 serializer coupled to output of the 8-to-1 serializer, where: the 8-to-1 serializer receives the parallel digital data (e.g., having a data width of 32-bits) from the digital data generator 104 and generates second parallel digital data (e.g., having a width of 4-bits); and the 4-to-1 serializer receives the second parallel digital data and generates serialized digital data (e.g., having a data width of 1-bit). Additionally, for some embodiments, the serializer 106 comprises a parallel input interface for receiving the parallel digital data, and a serial data output interface for outputting the serialized digital data.

The driver 108 of some embodiments receives serialized digital data from the serializer 106, and generates an amplified output signal based on the serialized digital data. For example, the driver 108 can comprise an analog driver. For various embodiments, the amplified output signal is intended to be received by a deserializer (not shown) of a SerDes communication system. Accordingly, the driver 108 can serve as a driver for a data transmitter.

For some embodiments, the data sampler 114 receives the amplified output signal from the driver 108, receives an interpolated clock signal from the divider 120, samples the amplified output signal at multiple (e.g., random) points based on the interpolated clock signal, and generates (and outputs) sample data based on the sampling. For some embodiments, the data sampler 114 comprises a sampler latch. According to various embodiments, the data sampler 114 facilitates sampling the pre-determined data pattern outputted by the serializer 106 and the driver 108, and outputting a plurality of sampled bits to the pattern checker 112.

For some embodiments, the pattern checker 112 receives and operates based on the interpolated clock signal from the divider 120. The pattern checker 112 can comprise a series of flip-flops, and the pattern checker 112 can operate by pre-loading the pre-determined data pattern into the series of flip-flops. According to various embodiments, while the PI 118 is set to an individual interpolator phase position (e.g., one of 128 phase positions), the PI 118 and the divider 120 generate the interpolated clock signal, and the data sampler 114 is sampling the output of the serializer 106 (via the driver 108) based on the interpolated clock signal and the pattern checker 112 collects for the individual interpolator phase position a plurality of sampled bits from the data sampler 114. In this way, as the digital data generator 104 generates a pre-determined data pattern, and the pre-determined data pattern is outputted as serialized data by the serializer 106 through the driver 108, the pattern checker 112 can collect from the data sampler 114 a plurality of sampled bits for the individual interpolator phase position (as the data sampler 114 samples the serialized data). Subsequently, the pattern checker 112 can error check the plurality of sampled bits for the individual interpolator phase position based on the pre-determined data pattern, and generate an error check result for the individual interpolator phase position based on the error check of the plurality of sampled bits.

For some embodiments, the pattern checker 112 collects the plurality of sampled bits from the data sampler 114 as the digital data generator generates pre-determined data pattern by storing the plurality of sampled bits in a (first) matrix associated with the individual interpolator phase position as it is collected from the data sampler 114. For some embodiments, the collected plurality of sampled bits (e.g., the first matrix) is stored on memory (e.g., set of registers), where the memory can be part of or separate from the pattern checker 112.

For some embodiments, the pattern checker 112 error checks the plurality of sampled bits by repeatedly performing iterations of a comparison operation for each individual row of a first matrix that stores the plurality of sampled bits for the individual interpolator phase position, where the comparison operation is repeated until a comparison pass value or a comparison fail value is generated for the individual row by the comparison operation. For some embodiments, the comparison operation comprises comparing the individual row to a corresponding row of a second matrix, where the second matrix comprises the pre-determined data pattern, and where the second matrix has the same dimensions as the first matrix. For instance, where the first matrix has dimensions of N× A (e.g., 4 bits×8 bits for 32-bit pre-defined data pattern), the second matrix would have the same dimensions. The comparison operation can determine whether the individual row of the first matrix matches the corresponding row of the second matrix based on the comparison, and can generate a comparison pass value (e.g., 1) in response to a match between the individual row and corresponding row. In response to the individual row of the first matrix not matching the corresponding row of the second matrix, the comparison operation can shift the individual row, by at least one bit position, to at least one of a left direction or a right direction, and can perform another iteration of the comparison operation for the individual row as shifted. An example of this is illustrated and described with respect to FIG. 3. Alternatively, the corresponding row can be shifted, by at least one bit position, to at least one of a left direction or a right direction, and can perform another iteration of the comparison operation for the corresponding row as shifted. Depending on the embodiment, the comparison operation can repeat the comparison operation (shifts) for certain number of iterations (e.g., an iteration threshold value) before generating a comparison fail value (e.g., 0) for the individual row.

For some embodiments, the pattern checker 112 generates the error check result for the individual interpolator phase position based on the checking the plurality of sampled bits for errors by: determining a number of individual rows of the first matrix that have the comparison pass value; and generating the error check result for the individual interpolator phase position based on the determining the number of individual rows of the first matrix that have the comparison pass value. For instance, the pattern checker 112 can determine whether the number of individual rows of the first matrix that have the comparison pass value surpasses a comparison pass threshold value (e.g., all rows of the first matrix), and in response to determining that the number surpasses the comparison pass threshold value, the pattern checker 112 can generate the error check result for the individual interpolator phase position to comprise a check pass value (e.g., 1). In response to determining that the number does not surpass the comparison pass threshold value, the pattern checker 112 can generate the error check result for the individual interpolator phase position to comprise a check fail value (e.g., 0).

According to various embodiments, the test controller 102 performs a data transmission test by generating a test result for the data transmission test based on a plurality of error check results the test controller 102 receives from the pattern checker 112 for a plurality of interpolator phase positions, where the plurality of interpolator phase positions is supported by the phase interpolator 118. As described herein, the plurality of error check results can be generated based on a plurality of sampled bits collected by the pattern checker 112, from the data sampler 114, as the digital data generator 104 generates a pre-determined data pattern and the pre-determined data pattern passes through the serializer 106 and the driver 108. In particular, for each individual interpolator phase position in a plurality of interpolator phase positions (e.g., all phase positions) supported by the phase interpolator 118: the test controller 102 can cause the phase interpolator to be set at the individual interpolator phase position, can cause the digital data generator 104 to generate a pre-determined data pattern, and can add the error check result (provided by the pattern checker 112) to a plurality of error check results. After these operations are performed for all of the plurality of interpolator phase positions, the test controller 102 can generate the test result for the data transmission test based on the plurality of error check results.

For some embodiments, the test controller 102 generates the test result for the data transmission test based on the plurality of error check results by determining a number of error check results in the plurality of error check results that have a check pass value, and generates the test result for the data transmission test based on the determining the number of error check results in the plurality of error check results that have a check pass value. For example, the test controller 102 can determine whether the number of error check results in the plurality of error check results that have the check pass value surpasses a test pass threshold value (e.g., at least a certain percentage of the error check results in the plurality of error check results have a check pass value). In response to determining that the number of error check results in the plurality of error check results that have the check pass value surpasses the test pass threshold value, the test controller 102 can generate the test result to comprise a test pass value; otherwise the test controller 102 can generate the test result to comprise a test fail value. For some embodiments, the test pass threshold value is such that less than all of the error check results have the check pass value.

Figure 2:
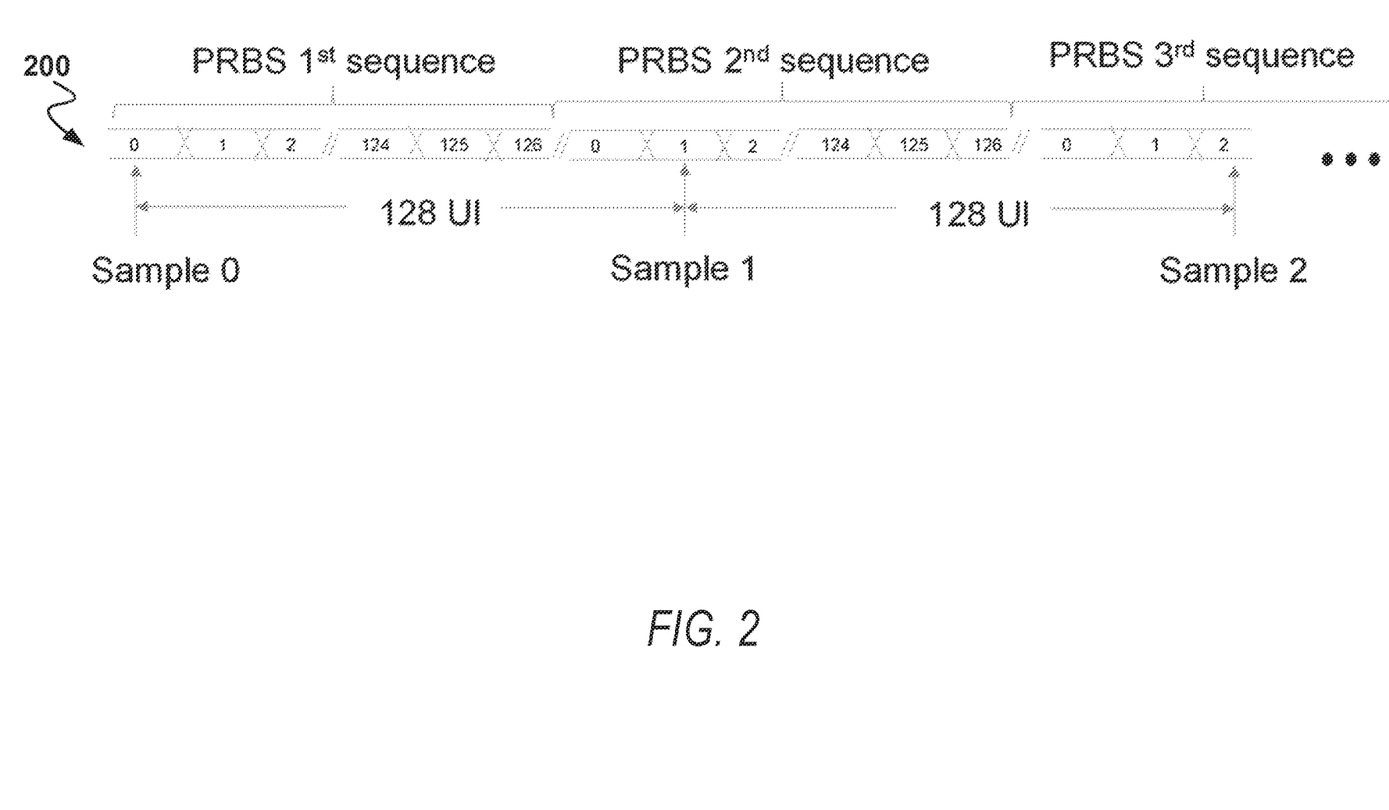
FIG. 2 is a diagram illustrating an example of a pre-defined data pattern being sampled by an interpolated clock signal, in accordance with various embodiments.

FIG. 2 is a diagram illustrating an example of a pre-defined data pattern 200 being sampled by an interpolated clock signal, in accordance with various embodiments. In particular, the pre-defined data pattern 200 comprises a PRBS that has 127 bits. As shown, the pre-defined data pattern 200 is repeatedly generated (e.g., by the digital data generator 104), and an interpolated clock signal a frequency of FUI/128 where FUI is the UI frequency. Based on the FUI/128 interpolated clock signal, a single bit of the pre-defined data pattern 200 is sampled by a data sampler (e.g., sampler 114) every 128 UIs. According to some embodiments, the sampled bits result in a plurality of sampled bits, which presumably comprises the entire pre-defined data pattern 200 as sampled. As described herein, the plurality of sampled bits can be provided to a pattern checker (e.g., 112) as described herein.

Figure 3:
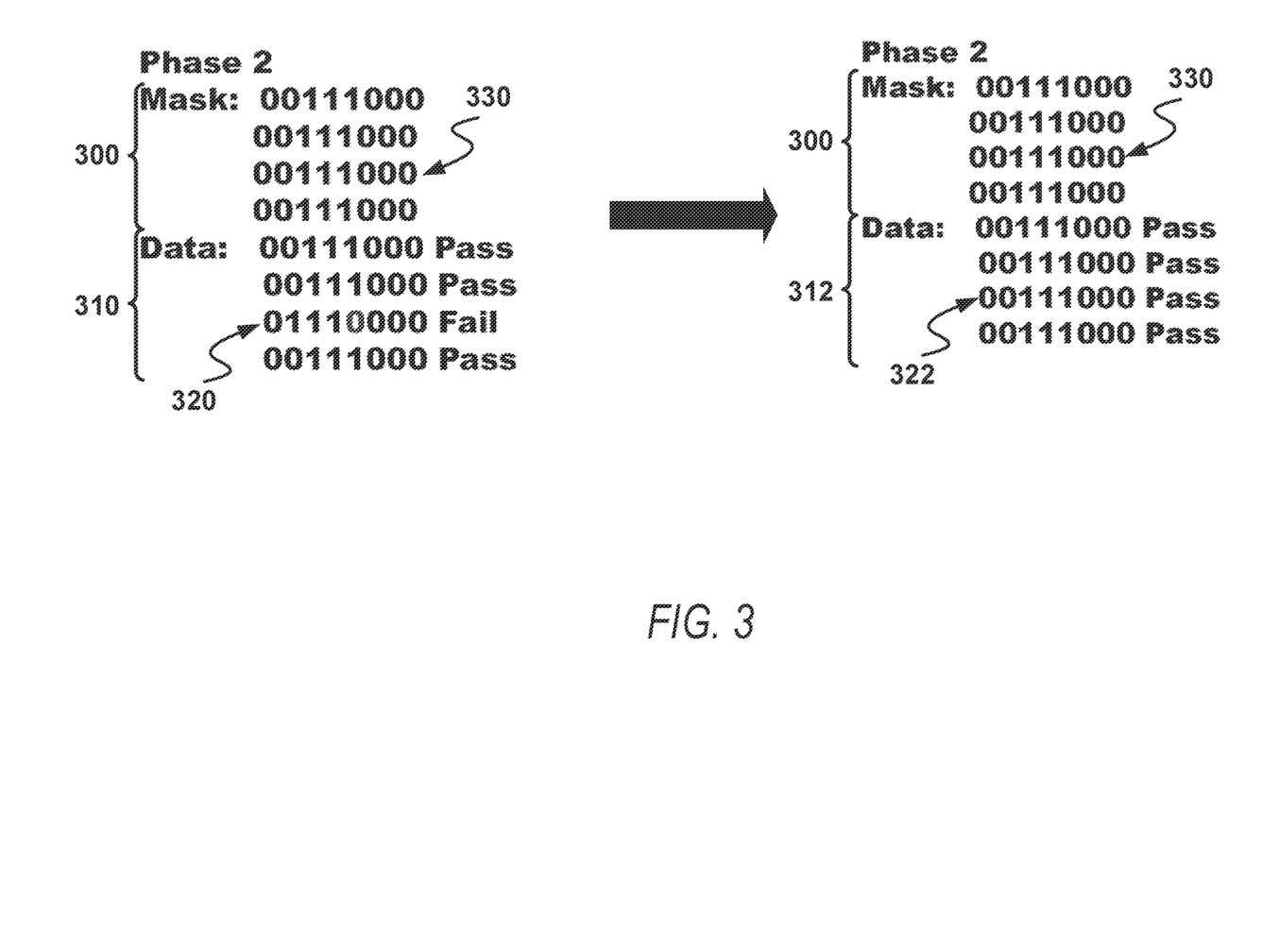
FIG. 3 is diagram illustrating an example of sampled bits being compared to a pre-defined data pattern, in accordance with various embodiments.

FIG. 3 is diagram illustrating an example of sampled bits being compared to a pre-defined data pattern, in accordance with various embodiments. In particular, data matrix 310 stores a plurality of bits sampled by a data sampler (e.g., 114) while a phase interpolator (e.g., 118) is set to phase 2 position. Data matrix 310 has dimensions of 4 bits×8 bits. Likewise, mask matrix 300 has dimensions of 4 bits×8 bits. For various embodiments, the data matrix 310 is used by a pattern checker (e.g., 112) to error check the sampled bits for the phase 2 position by comparing mask matrix 300 against data matrix 310. When data matrix 310 is compared against mask matrix 300, the third row (320) of data matrix 310 mismatches the corresponding row 330 of mask matrix 300, which results in a fail. In accordance with various embodiments, the third row (320) of data matrix 310 is shifted (e.g., by the pattern checker 112) by one bit in a right direction, thereby resulting in data matrix 312. When data matrix 312 is compared against mask matrix 300, the third row (322) of data matrix 312 matches the corresponding row 330 of mask matrix 300, which results in a pass. If, however, a mismatch resulted, for some embodiments, the pattern checker (e.g., 112) can continue to shift by one bit in a right direction. Although FIG. 3 illustrates an example of shifting a row of a data matrix, for some embodiments, a row of a mask matrix can be shifted instead. Additionally, though FIG. 3 illustrates a row being shifted by one bit and in a right direction, for some embodiments, a row can be shifted by more than one bit and can be shifted in a left direction. By using a data matrix and a mask matrix, various embodiments can reduce a measured eye width of a serializer, and can shift read data for a UI.

Figure 4:
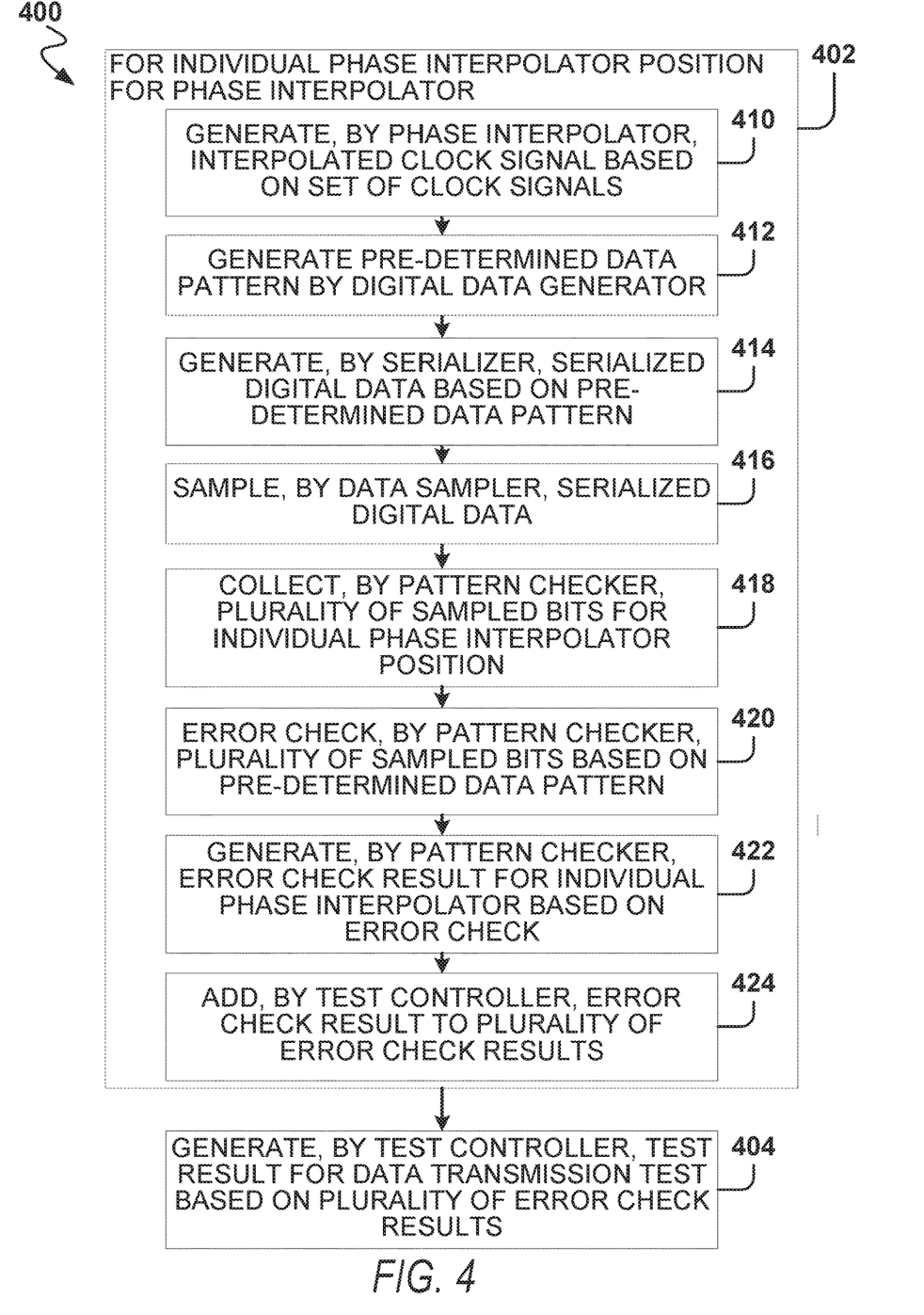
FIG. 4 is a flowchart illustrating an example method for testing a transmitter with interpolation, in accordance with some embodiments.

FIG. 4 is a flowchart illustrating an example method 400 for testing a transmitter with interpolation, in accordance with some embodiments. Some or all of the method 400 can be performed by a circuit such as the circuit 100 described herein with respect with FIG. 1. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 4, the method 400 begins with operation 402, where operations 410 through 424 are performed for each individual phase interpolator position in a plurality of interpolator phase positions (e.g., all or less than all positions) supported by a phase interpolator (e.g., 118). At operation 410, the phase interpolator (e.g., 118) generates an interpolated clock signal based on a set of clock signals (e.g., from the PLL 116) while the phase interpolator is set to the individual interpolator phase position. As noted herein, the interpolated clock signal generated by the phase interpolator can pass through a divider (e.g., 120) prior to being provided to other components (e.g., the pattern checker 112 and the data sampler 114). For some embodiments, a test controller (e.g., 102) causes the phase interpolator to be set to the individual interpolator phase position.

At operation 412, a digital data generator (e.g., 104) generates a pre-determined data pattern (e.g., PRBS). The digital data generator can generate the pre-determined data pattern based on input (e.g., instructions) from a test controller (e.g., 102).

At operation 414, a serializer (e.g., 106) generates serialized digital data based on the pre-determined data pattern (generated by operation 412), where the serializer operates based on the set of clock signals.

At operation 416, a data sampler (e.g., 114), operating based on the interpolated clock signal (generated by operation 410), samples the serialized digital data (generated by operation 414).

At operation 418, a pattern checker (e.g., 112), operating based on the interpolated clock signal (generated by operation 410), collects a plurality of sampled bits for the individual phase interpolator as the digital data generator (e.g., 104) generates the pre-determined data pattern, where the plurality of sampled bits is provided by the data sampler (e.g., 114). For various embodiments, operation 418 comprises the pattern checker storing the plurality of sampled bits in a first matrix associated with the individual interpolator phase position.

At operation 420, the pattern checker error checks the plurality of sampled bits for the individual interpolator phase position based on the pre-determined data pattern. As described herein, the plurality of sampled bits can be stored in a first matrix and the pre-determined data pattern can be stored in a second matrix, thereby permitting the pattern checker to compare the first matrix to (e.g., against) the second matrix to error check the plurality of sampled bits. For various embodiments, operation 420 comprises the pattern checker repeatedly performing iterations of a comparison operation, for each individual row of the first matrix associated with the individual interpolator phase position, until a comparison pass value or a comparison fail value is generated for the individual row by the comparison operation.

At operation 422, the pattern checker generates an error check result for the individual interpolator phase position based on the error checking the plurality of sampled bits (provided by the data sampler 114). For various embodiments, operation 422 comprises the pattern checker determining a number of individual rows of the first matrix that have the comparison pass value, and the pattern checker generates the error check result for the individual interpolator phase position based on the determining the number of individual rows of the first matrix that have the comparison pass value. Thereafter, at operation 424, a test controller (e.g., 102) adds the error check result (e.g., from the pattern checker 112) to a plurality of error check results.

Eventually, at operation 404, the test controller (e.g., 102) generates a test result for a data transmission test based on the plurality of error check results. For various embodiments, operation 404 comprises the test controller determining a number of error check results in the plurality of error check results that have a check pass value, and generating the test result for the data transmission test based on the determining the number of error check results in the plurality of error check results that have a check pass value.

Figure 5:
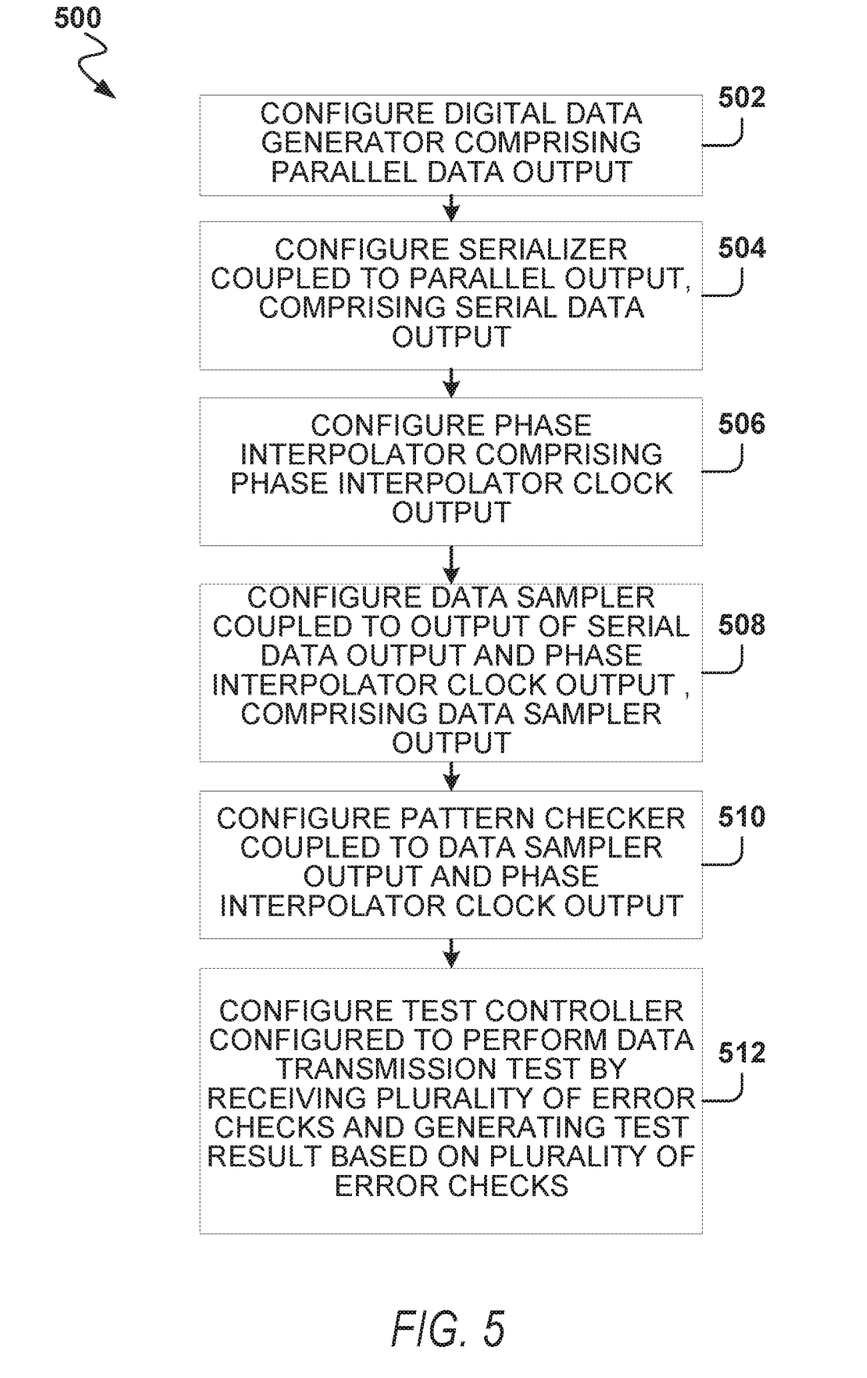
FIG. 5 is a flowchart illustrating an example method for generating a circuit design that includes transmitter testing with interpolation, in accordance with some embodiments.

FIG. 5 is a flowchart illustrating an example method 500 for generating a circuit design that includes transmitter testing with interpolation, in accordance with some embodiments. It will be understood that the method 500 can be performed by a device, such as a computing device executing instructions of an EDA software system, in accordance with some embodiments. Additionally, the method 500 herein can be implemented in the form of executable instructions stored on a computer-readable medium or in the form of electronic circuitry. For instance, the operations of the method 500 may be represented by executable instructions that, when executed by a processor of a computing device, cause the computing device to perform the method 500. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 5, the method 500 begins with operation 502, where a digital data generator (e.g., 104) is configured within the circuit design, where the digital data generator comprises a parallel data output, and where the parallel data output provides parallel digital data that is generated by the digital data generator. At operation 504, a serializer (e.g., 106) is configured within the circuit design, where the serializer is coupled to the parallel data output, where the serializer comprises a serial data output, and where the serial data output provides serialized digital data that is generated by the serializer based on the parallel digital data and a set of clock signals. At operation 506, a phase interpolator (e.g., 118) is configured within the circuit design, where the phase interpolator comprises a phase interpolator clock output, and where the phase interpolator clock output provides an interpolated clock signal that is generated by the phase interpolator based on the set of clock signals. At operation 508, a data sampler (e.g., 114) is configured within the circuit design, where the data sampler is coupled to the serial data output and the phase interpolator clock output, where the data sampler comprises a data sampler output, and where the data sampler is configured to sample the serialized digital data based on the interpolated clock signal. At operation 510, a pattern checker (e.g., 112) is configured within the circuit design, where the pattern checker is coupled to the data sampler output and the phase interpolator clock output. At operation 512, a test controller (e.g., 102) is configured within the circuit design, where the test controller is configured to perform a data transmission test by: receiving, from the pattern checker (e.g., 112), a plurality of error check results for a plurality of interpolator phase positions supported by the phase interpolator; and generating a test result for the data transmission test based on the plurality of error check results. For various embodiments, the plurality of error check results is generated (e.g., by the pattern checker 112) based on a plurality of sampled bits collected by the pattern checker (e.g., 112), from the data sampler (e.g., 114), as the digital data generator (e.g., 104) generates a pre-determined data pattern.

Figure 6:
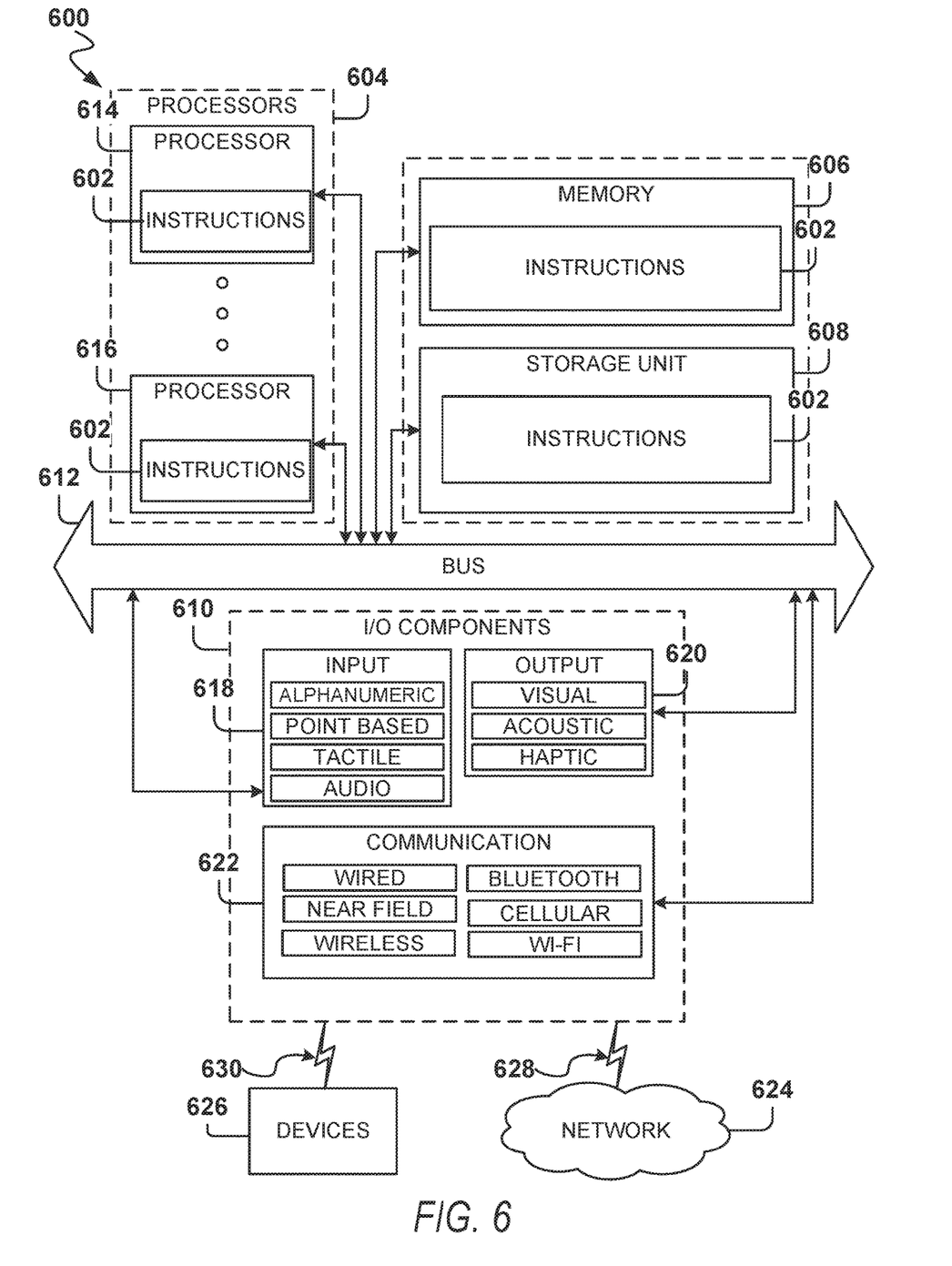
FIG. 6 is a block diagram illustrating components of a machine, according to some example embodiments, able to read instructions from a machine-readable medium and perform any one or more of the methodologies discussed herein.

FIG. 6 is a block diagram illustrating components of a machine 600, according to some example embodiments, able to read instructions from a machine-readable medium (e.g., a machine-readable storage medium) and perform any one or more of the methodologies discussed herein. Specifically, FIG. 6 shows a diagrammatic representation of the machine 600 in the example form of a system within which instructions 602 (e.g., software, a program, an application, an applet, an app, a driver, or other executable code) for causing the machine 600 to perform any one or more of the methodologies discussed herein may be executed. For example, the instructions 602 include executable code that causes the machine 600 to execute the method 500 described with respect to FIG. 5. In this way, these instructions 602 transform the general, non-programmed machine 600 into a particular machine programmed to carry out the described and illustrated method 500 in the manner described herein. The machine 600 may operate as a standalone device or may be coupled (e.g., networked) to other machines.

By way of non-limiting example, the machine 600 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 602, sequentially or otherwise, that specify actions to be taken by the machine 600. Further, while only a single machine 600 is illustrated, the term "machine" shall also be taken to include a collection of machines 600 that individually or jointly execute the instructions 602 to perform any one or more of the methodologies discussed herein.

The machine 600 may include processors 604, memory 606, a storage unit 608, and I/O components 610, which may be configured to communicate with each other such as via a bus 612. In an example embodiment, the processors 604 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 614 and a processor 616 that may execute the instructions 602. The term "processor" is intended to include multi-core processors 604 that may comprise two or more independent processors (sometimes referred to as "cores") that may execute instructions 602 contemporaneously. Although FIG. 6 shows multiple processors 604, the machine 600 may include a single processor with a single core, a single processor with multiple cores (e.g., a multi-core processor), multiple processors with a single core, multiple processors with multiple cores, or any combination thereof.

The memory 606 (e.g., a main memory or other memory storage) and the storage unit 608 are both accessible to the processors 604 such as via the bus 612. The memory 606 and the storage unit 608 store the instructions 602 embodying any one or more of the methodologies or functions described herein. The instructions 602 may also reside, completely or partially, within the memory 606, within the storage unit 608, within at least one of the processors 604 (e.g., within the processor's cache memory), or any suitable combination thereof, during execution thereof by the machine 600. Accordingly, the memory 606, the storage unit 608, and the memory of the processors 604 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 602. The term "machine-readable medium" shall also be taken to include any medium, or combination of multiple media, that is capable of storing instructions (e.g., instructions 602) for execution by a machine (e.g., machine 600), such that the instructions, when executed by one or more processors of the machine (e.g., processors 604), cause the machine to perform any one or more of the methodologies described herein (e.g., method 500). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 610 may include a wide variety of components to receive input, provide output, produce output, transmit information, exchange information, capture measurements, and so on. The specific I/O components 610 that are included in a particular machine 600 will depend on the type of the machine 600. For example, portable machines such as mobile phones will likely include a touch input device or other such input mechanisms, while a headless server machine will likely not include such a touch input device. It will be appreciated that the I/O components 610 may include many other components that are not specifically shown in FIG. 6. The I/O components 610 are grouped according to functionality merely for simplifying the following discussion and the grouping is in no way limiting. In various example embodiments, the I/O components 610 may include input components 618 and output components 620. The input components 618 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 620 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 610 may include communication components 622 operable to couple the machine 600 to a network 624 or devices 626 via a coupling 628 and a coupling 630 respectively. For example, the communication components 622 may include a network interface component or another suitable device to interface with the network 624. In further examples, the communication components 622 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 626 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 7:
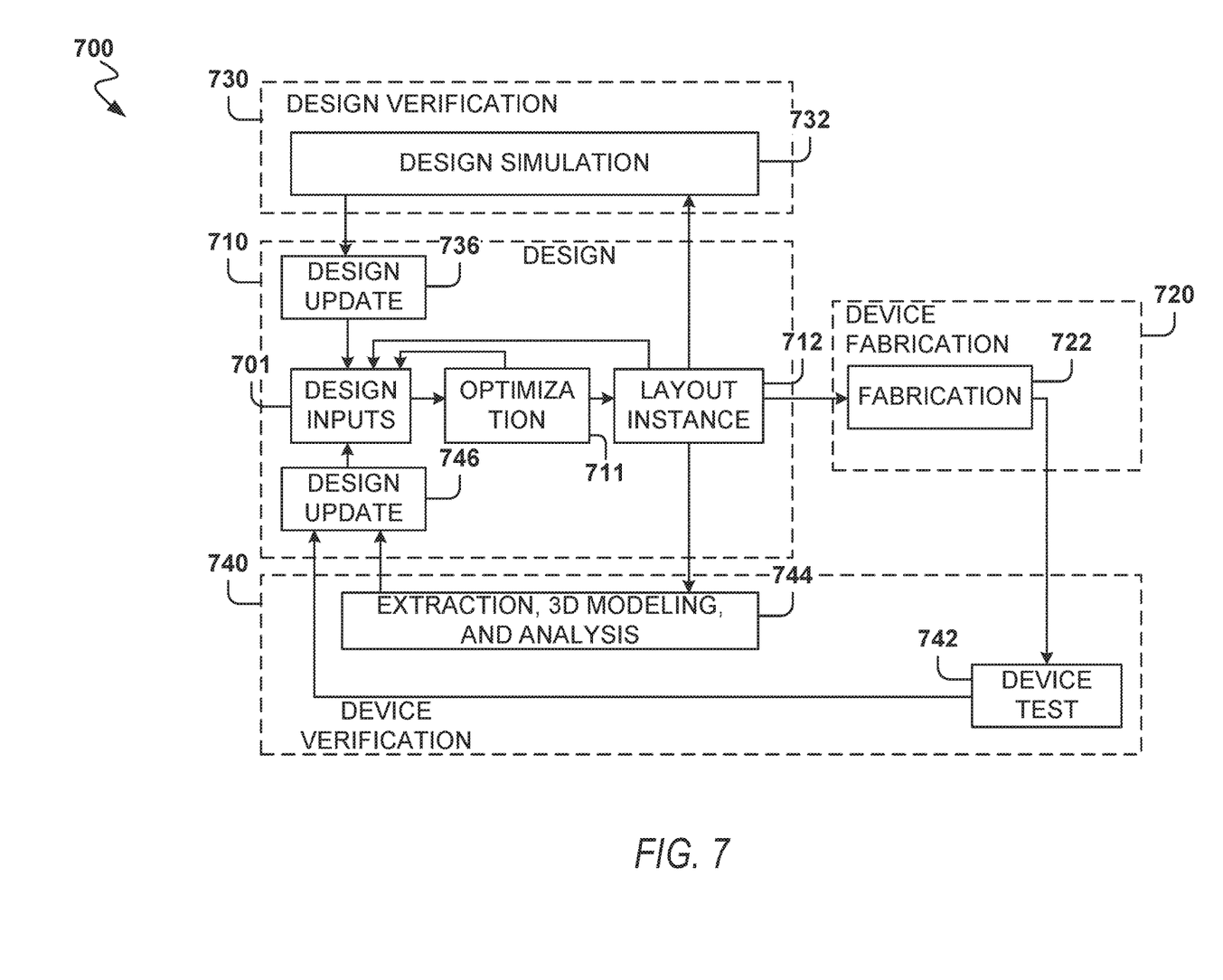
FIG. 7 is a diagram illustrating one possible design process flow for generating a circuit, including embodiments to implement transmitter testing with interpolation as described herein, and in various embodiments, to integrate the transmitter testing with a larger circuit.

FIG. 7 is a diagram illustrating one possible design process flow for generating a circuit, including embodiments to implement transmitter testing with interpolation as described herein, and in various embodiments, to integrate the transmitter testing with a larger circuit (e.g., SerDes circuit). As illustrated, the overall design flow 700 includes a design phase 710, a device fabrication phase 720, a design verification phase 730, and a device verification phase 740. The design phase 710 involves an initial design input operation 701 where the basic elements and functionality of a device are determined, as well as revisions based on various analyses and optimization of a circuit design. This design input operation 701 is where instances of an EDA circuit design file are used in the design and any additional circuitry is selected. The initial strategy, tactics, and context for the device to be created are also generated in the design input operation 701, depending on the particular design algorithm to be used.

In some embodiments, following an initial selection of design values in the design input operation 701, timing analysis and optimization according to various embodiments occurs in an optimization operation 711, along with any other automated design processes. One such process may be the automated design of a partitioned root search for error locator polynomial functions in RS FEC decoding. As described below, design constraints for blocks of a circuit design generated with design inputs in the design input operation 701 may be analyzed using hierarchical timing analysis, according to various embodiments. While the design flow 700 shows such optimization occurring prior to a layout instance 712, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 722.

After design inputs are used in the design input operation 701 to generate a circuit layout, and any optimization operations 711 are performed, a layout is generated in the layout instance 712. The layout describes the physical layout dimensions of the device that match the design inputs. This layout may then be used in the device fabrication operation 722 to generate a device, or additional testing and design updates may be performed using designer inputs or automated updates based on design simulation 732 operations or extraction, 3D modeling, and analysis 744 operations. Once the device is generated, the device can be tested as part of device test 742 operations, and layout modifications generated based on actual device performance.

As described in more detail below, design updates 736 from the design simulation 732, design updates 746 from the device test 742, the extraction, 3D modeling, and analysis 744 operations, or the design input operation 701 may occur after an initial layout instance 712 is generated. In various embodiments, whenever design inputs are used to update or change an aspect of a circuit design, a timing analysis and optimization operation 711 may be performed.

For example, in various embodiments, a user may provide an input to a computing device indicating placement of elements of a circuit within a first portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
a digital data generator comprising a parallel data output, the parallel data output providing parallel digital data, the parallel digital data being generated by the digital data generator;
a serializer coupled to the parallel data output, the serializer comprising a serial data output, the serial data output providing serialized digital data, the serialized digital data being generated by the serializer based on the parallel digital data and a set of clock signals;
a phase interpolator comprising a phase interpolator clock output, the phase interpolator clock output providing an interpolated clock signal, the interpolated clock signal being generated by the phase interpolator based on the set of clock signals;
a data sampler coupled to the serial data output and the phase interpolator clock output, the data sampler comprising a data sampler output, and the data sampler being configured to sample the serialized digital data based on the interpolated clock signal;
a pattern checker coupled to the data sampler output and the phase interpolator clock output; and
a test controller configured to perform a data transmission test by generating a test result for the data transmission test based on a plurality of error check results for a plurality of interpolator phase positions supported by the phase interpolator, the plurality of error check results being generated by the pattern checker based on sampled bits collected by the pattern checker, from the data sampler, as the digital data generator generates a pre-determined data pattern.

2. The circuit of claim 1, wherein the test controller is further configured to perform the data transmission test by:
for each individual interpolator phase position in the plurality of interpolator phase positions supported by the phase interpolator:
causing the phase interpolator to be set to the individual interpolator phase position;
causing the digital data generator to generate the pre-determined data pattern, the pattern checker being configured to collect from the data sampler a plurality of sampled bits for the individual interpolator phase position as the digital data generator generates the pre-determined data pattern, to error check the plurality of sampled bits for the individual interpolator phase position based on the pre-determined data pattern, and to generate an error check result for the individual interpolator phase position based on the error checking the plurality of sampled bits; and
adding the error check result to the plurality of error check results.

3. The circuit of claim 2, wherein the pattern checker is configured to collect from the data sampler the plurality of sampled bits for the individual interpolator phase position as the digital data generator generates pre-determined data pattern by:
storing the plurality of sampled bits in a first matrix associated with the individual interpolator phase position.

4. The circuit of claim 3, wherein the pattern checker is configured to error check the plurality of sampled bits for the individual interpolator phase position based on the pre-determined data pattern by:
for each individual row of the first matrix associated with the individual interpolator phase position, repeatedly performing iterations of a comparison operation for the individual row until a comparison pass value or a comparison fail value is generated for the individual row by the comparison operation.

5. The circuit of claim 4, wherein the comparison operation comprises:
comparing the individual row to a corresponding row of a second matrix, the second matrix comprising the pre-determined data pattern, and the second matrix having same dimensions as the first matrix;
determining whether the individual row matches the corresponding row based on the comparing;
in response to determining that the individual row matches the corresponding row, generating the comparison pass value for the individual row; and
in response to determining that the individual row does not match the corresponding row:
determining whether a number of iterations of the comparison operation has been performed for the individual row that surpasses an iteration threshold value;
in response to determining that the number of iterations of the comparison operation has been performed for the individual row that surpasses the iteration threshold value, generating the comparison fail value for the individual row; and
in response to determining that the number of iterations of the comparison operation that has been performed for the individual row does not surpass the iteration threshold value:
shifting the individual row, by at least one bit position, to at least one of a left direction or a right direction; and
performing another iteration of the comparison operation for the individual row as shifted.

6. The circuit of claim 4, wherein the pattern checker is configured to generate the error check result for the individual interpolator phase position based on the checking the plurality of sampled bits for errors by:
determining a number of individual rows of the first matrix that have the comparison pass value; and
generating the error check result for the individual interpolator phase position based on the determining the number of individual rows of the first matrix that have the comparison pass value.

7. The circuit of claim 6, wherein the generating the error check result for the individual interpolator phase position based on the determining the number of individual rows of the first matrix that have the comparison pass value comprises:
determining whether the number of individual rows of the first matrix that have the comparison pass value surpasses a comparison pass threshold value; and
in response to determining that the number of individual rows of the first matrix that have the comparison pass value surpasses the comparison pass threshold value, generating the error check result for the individual interpolator phase position to comprise a check pass value.

8. The circuit of claim 7, wherein the generating the error check result for the individual interpolator phase position based on the determining the number of individual rows of the first matrix that have the comparison pass value further comprises:

in response to determining that the number of individual rows of the first matrix that have the comparison pass value does not surpass the comparison pass threshold value, generating the error check result for the individual interpolator phase position to comprise a check fail value.

9. The circuit of claim 1, wherein the generating the test result for the data transmission test based on the plurality of error check results comprises:

determining a number of error check results in the plurality of error check results that have a check pass value; and generating the test result for the data transmission test based on the determining the number of error check results in the plurality of error check results that have the check pass value.

10. The circuit of claim 9, wherein the generating the test result for the data transmission test based on the determining the number of error check results in the plurality of error check results that have the check pass value comprises:

determining whether the number of error check results in the plurality of error check results that have the check pass value surpasses a test pass threshold value; and in response to determining that the number of error check results in the plurality of error check results that have the check pass value surpasses the test pass threshold value, generating the test result to comprise a test pass value.

11. The circuit of claim 10, wherein the generating the test result for the data transmission test based on the determining the number of error check results in the plurality of error check results that have the check pass value further comprises:

in response to determining that the number of error check results in the plurality of error check results that have the check pass value does not surpass the test pass threshold value, generating the test result to comprise a test fail value.

12. The circuit of claim 1, wherein the pre-determined data pattern comprises a pseudorandom binary sequence (PRBS).

13. The circuit of claim 1, wherein the pattern checker comprises a series of flip-flops, the pattern checker operating by pre-loading the pre-determined data pattern into the series of flip-flops.

14. A method comprising:

for each individual interpolator phase position in a plurality of interpolator phase positions supported by a phase interpolator:

generating, by the phase interpolator, an interpolated clock signal based on a set of clock signals while the phase interpolator is set to the individual interpolator phase position;

generating, by a digital data generator, a pre-determined data pattern;

generating, by a serializer, serialized digital data based on the pre-determined data pattern, where the serializer operates based on the set of clock signals;

sampling, by a data sampler operating based on the interpolated clock signal, the serialized digital data;

collecting, by a pattern checker operating based on the interpolated clock signal, a plurality of sampled bits for the individual phase interpolator as the digital data generator generates the pre-determined data pattern, the plurality of sampled bits being provided by the data sampler;

error checking, by the pattern checker, the plurality of sampled bits for the individual interpolator phase position based on the pre-determined data pattern;

generating, by the pattern checker, an error check result for the individual interpolator phase position based on the error checking the plurality of sampled bits; and adding, by a test controller, the error check result to a plurality of error check results; and generating, by the test controller, a test result for a data transmission test based on the plurality of error check results.

15. The method of claim 14, further comprising:
setting, by the test controller, the phase interpolator to the individual interpolator phase position.

16. The method of claim 15, wherein the collecting the plurality of sampled bits for the individual interpolator phase position as the digital data generator generates the pre-determined data pattern comprises:

storing the plurality of sampled bits in a first matrix associated with the individual interpolator phase position.

17. The method of claim 16, wherein the error checking the plurality of sampled bits for the individual interpolator phase position based on the pre-determined data pattern comprises:

for each individual row of the first matrix associated with the individual interpolator phase position, repeatedly performing iterations of a comparison operation for the individual row until a comparison pass value or a comparison fail value is generated for the individual row by the comparison operation.

18. The method of claim 17, wherein the generating the error check result for the individual interpolator phase position based on the error checking the plurality of sampled bits comprises:

determining a number of individual rows of the first matrix that have the comparison pass value; and generating the error check result for the individual interpolator phase position based on the determining the number of individual rows of the first matrix that have the comparison pass value.

19. The method of claim 14, wherein the generating the test result for the data transmission test based on the plurality of error check results comprises:

determining a number of error check results in the plurality of error check results that have a check pass value; and generating the test result for the data transmission test based on the determining the number of error check results in the plurality of error check results that have a check pass value.

20. A non-transitory computer-readable medium comprising instructions that, when executed by one or more processors of a computing device, cause the computing device to generate a circuit design by performing operations comprising:

configuring, in the circuit design, a digital data generator that comprises a parallel data output, the parallel data output providing parallel digital data, the parallel digital data being generated by the digital data generator;

configuring, in the circuit design, a serializer coupled to the parallel data output, the serializer comprising a serial data output, the serial data output providing serialized digital data, the serialized digital data being generated by the serializer based on the parallel digital data and a set of clock signals;

configuring, in the circuit design, a phase interpolator that comprises a phase interpolator clock output, the phase interpolator clock output providing an interpolated clock signal, the interpolated clock signal being generated by the phase interpolator based on the set of clock signals;

configuring, in the circuit design, a data sampler coupled to the serial data output and the phase interpolator clock output, the data sampler comprising a data sampler output, and the data sampler being configured to sample the serialized digital data based on the interpolated clock signal;

configuring, in the circuit design, a pattern checker coupled to the data sampler output and the phase interpolator clock output; and configuring, in the circuit design, a test controller configured to perform a data transmission test by:

receiving, from the pattern checker, a plurality of error check results for a plurality of interpolator phase positions supported by the phase interpolator, the plurality of error check results being generated based on a plurality of sampled bits collected by the pattern checker, from the data sampler, as the digital data generator generates a pre-determined data pattern; and generating a test result for the data transmission test based on the plurality of error check results.

* * * * *